（12）United States Patent
Du

(10) Patent No.: US 11,170,195 B2
(45) Date of Patent: Nov. 9, 2021

(54) FINGERPRINT IDENTIFICATION APPARATUS AND ELECTRONIC DEVICE

(71) Applicant: SHENZHEN GOODIX TECHNOLOGY CO., LTD., Shenzhen (CN)

(72) Inventor: Canhong Du, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/890,553

(22) Filed: Jun. 2, 2020

(65) Prior Publication Data

US 2020/0293741 A1  Sep. 17, 2020

Related U.S. Application Data

(63) Continuation of application No. PCT/CN2019/074619, filed on Feb. 2, 2019.

(51) Int. Cl.
*G06K 9/00* (2006.01)
(52) U.S. Cl.
CPC ....... *G06K 9/0004* (2013.01); *G06K 9/00053* (2013.01)
(58) Field of Classification Search
CPC ............................. G06K 9/0004; G06F 3/042
See application file for complete search history.

(56) References Cited

U.S. PATENT DOCUMENTS

| 2017/0083745 | A1* | 3/2017 | Goodelle | G06K 9/00053 |
| 2017/0270342 | A1 | 9/2017 | He et al. | |
| 2017/0271546 | A1* | 9/2017 | Hou | G06K 9/2018 |
| 2017/0286743 | A1 | 10/2017 | Lee et al. | |
| 2019/0012512 | A1 | 1/2019 | He et al. | |
| 2019/0180072 | A1* | 6/2019 | Fomani | G06K 9/00046 |
| 2020/0034594 | A1* | 1/2020 | Julian | H01L 23/12 |
| 2020/0050823 | A1 | 2/2020 | Jiang et al. | |
| 2020/0117878 | A1 | 4/2020 | Li et al. | |
| 2020/0210671 | A1* | 7/2020 | Ling | G02B 27/30 |

(Continued)

FOREIGN PATENT DOCUMENTS

| CN | 106845451 A | 6/2017 |
| CN | 109074477 A | 12/2018 |
| CN | 109074492 A | 12/2018 |

(Continued)

*Primary Examiner* — Joseph R Haley
(74) *Attorney, Agent, or Firm* — Scully Scott Murphy & Presser

(57) ABSTRACT

Embodiments of the present application disclose a fingerprint identification apparatus and an electronic device. The fingerprint identification apparatus is applicable to an electronic device having a display screen and comprises: an optical fingerprint sensor disposed under the display screen, wherein the optical fingerprint sensor comprises a photosensitive region, the photosensitive region comprises a plurality of sensing units, and the sensing units are configured to detect an optical signal returned via reflection on a finger surface; a light path directing structure disposed between the display screen and the optical fingerprint sensor; and a filter film formed above the photosensitive region of the optical fingerprint sensor and configured to filter the optical signal to filter out interference light.

17 Claims, 7 Drawing Sheets

(56) References Cited

U.S. PATENT DOCUMENTS

2020/0234026 A1    7/2020   Du
2020/0285345 A1*   9/2020   Xiang .................. G06K 9/0004

FOREIGN PATENT DOCUMENTS

| | | |
|---|---|---|
| CN | 109154869 A | 1/2019 |
| CN | 209525659 U | 10/2019 |
| EP | 3620975 A1 | 3/2020 |
| EP | 3706036 A1 | 9/2020 |
| JP | 2006318018 A | 11/2006 |
| WO | 2017211152 A1 | 12/2017 |

* cited by examiner

FINGERPRINT IDENTIFICATION APPARATUS AND ELECTRONIC DEVICE

CROSS-REFERENCE TO RELATED APPLICATIONS

This application is a continuation of International Application No. PCT/CN2019/074619, filed on Feb. 2, 2019, the disclosure of which is hereby incorporated by reference in its entirety.

TECHNICAL FIELD

Embodiments of the present application relate to the field of fingerprint identification, and more particularly, to a fingerprint identification apparatus and an electronic device.

BACKGROUND

With rapid development of mobile phone industry, a fingerprint identification technology has received more and more attention from people, and practicality of an under-screen fingerprint identification technology has become a popular requirement. An optical under-screen fingerprint identification technology refers that an optical fingerprint sensor captures reflected light formed by reflection of a finger from light emitted by a light source, where the reflected light carries fingerprint information of the finger, so as to implement under-screen fingerprint identification.

A conventional optical fingerprint identification apparatus may include a light path directing structure, and the light path directing structure may directly image an optical signal reflected by a finger onto a fingerprint sensor. However, an imaging effect of the light path directing structure is related to an optical path between the light path directing structure and the finger. The longer the optical path between the light path directing structure and the finger is, the worse the imaging effect is. Therefore, how to reduce an optical path between a light path directing structure and a finger to improve an imaging effect of the light path directing structure is an urgent problem.

SUMMARY

Embodiments of the present application provide a fingerprint identification apparatus and an electronic device, which can improve an imaging effect of a light path directing structure.

In a first aspect, provided is a fingerprint identification apparatus applicable to an electronic device having a display screen, the fingerprint identification apparatus including: an optical fingerprint sensor disposed under the display screen to implement under-screen optical fingerprint detection, where the optical fingerprint sensor includes a photosensitive region, the photosensitive region includes a plurality of sensing units, and the sensing units are configured to detect an optical signal returned via reflection on a finger surface; a light path directing structure disposed between the display screen and the optical fingerprint sensor to transmit the optical signal returned via the reflection on the finger surface to the photosensitive region of the optical fingerprint sensor; and a filter film formed above the photosensitive region of the optical fingerprint sensor and configured to filter the optical signal to filter out interference light.

In some possible implementation manners, the filter film is a plating film formed on a surface of the optical fingerprint sensor, and the plating film covers the sensing units of the photosensitive region.

In some possible implementation manners, the optical fingerprint sensor is used as a base material of the filter film to bear the filter film to form a filter configured to filter out the interference light.

In some possible implementation manners, the filter film is a plating film formed on a surface of the light path directing structure, and the plating film covers a part of the light path directing structure corresponding to the photosensitive region of the optical fingerprint sensor.

In some possible implementation manners, the light path directing structure is used as a base material of the filter film to bear the filter film to form a filter configured to filter out the interference light.

In some possible implementation manners, the light path directing structure is integrated with the filter film and the optical fingerprint sensor into a same optical fingerprint sensor chip; or the light path directing structure is disposed above the optical fingerprint sensor as an independent component.

In some possible implementation manners, the light path directing structure includes a micro-lens layer and a micro-hole layer, the micro-lens layer includes a micro-lens array having a plurality of micro-lenses, the micro-hole layer includes a micro-hole array having a plurality of micro-holes, and the micro-hole array is formed under the micro-lens array.

In some possible implementation manners, there is a one-to-one correspondence relationship between the micro-lenses and the micro-holes, and each pair of a micro-lens and a micro-hole corresponds to one of the sensing units of the optical fingerprint sensor, respectively; and the micro-lenses are configured to converge the optical signal returned via the reflection on the finger surface to the micro-holes and transmit the optical signal to corresponding sensing units through the micro-holes.

In some possible implementation manners, the micro-lenses and the micro-holes are aligned with the sensing units in a direction perpendicular to a surface of the optical fingerprint sensor to transmit an optical signal in a vertical direction to the sensing units under the micro-lenses and the micro-holes.

In some possible implementation manners, the micro-lenses and the micro-holes are aligned with the sensing units in a direction having a certain tilt angle with respect to a surface of the optical fingerprint sensor to transmit an optical signal incident at a tilt angle to the sensing units under the micro-lenses and the micro-holes.

In some possible implementation manners, the light path directing structure further includes a flat layer formed on a surface of the micro-lens layer, the flat layer covers the micro-lens array, and the filter film is formed on a surface of the flat layer, where the flat layer is used as a base material of the filter film to bear the filter film.

In some possible implementation manners, the light path directing structure further includes a first transparent medium layer and a second transparent medium layer, and the first transparent medium layer is formed above the micro-hole layer and at least partially fills the micro-holes; and the second transparent medium layer is formed under the micro-hole layer.

In some possible implementation manners, the filter film is formed on a lower surface of the second transparent medium layer, and the second transparent medium layer is used as a base material for bearing the filter film.

In some possible implementation manners, the light path directing structure includes a collimator, the collimator is disposed above the filter film and includes a collimating through hole array having a plurality of collimating through holes, and an extension direction of the collimating through holes is perpendicular to a surface of the optical fingerprint sensor or has a certain tilt angle with respect to a surface of the optical fingerprint sensor.

In some possible implementation manners, an upper surface of the optical fingerprint sensor is provided with a first pad for connecting with a substrate.

In some possible implementation manners, the optical fingerprint sensor is provided with a trench, a surface of the trench is lower than the upper surface of the optical fingerprint sensor, the surface of the trench is provided with a second pad for connecting with the substrate, and the first pad and the second pad are electrically connected through a redistribution layer.

In some possible implementation manners, a difference in height between the surface of the trench and the upper surface of the optical fingerprint sensor is greater than or equal to 30 μm.

In some possible implementation manners, the optical fingerprint sensor further includes a through silicon via, and the through silicon via is used to connect the first pad to the substrate.

In some possible implementation manners, a lower surface of the optical fingerprint sensor is provided with a solder ball for soldering to the substrate, and the first pad is connected to the solder ball through the through silicon via.

In some possible implementation manners, the optical fingerprint sensor is a backside illumination fingerprint sensor, and the backside illumination fingerprint sensor is configured in a flip chip packaging manner to enable a front side to face a substrate and a back side to face the display screen, and the filter film is plated on a back side of the optical fingerprint sensor.

In a second aspect, provided is an electronic device, the electronic device including: a display screen, and the fingerprint identification apparatus according to the first aspect and any one of possible implementation manners of the first aspect.

According to technical solutions provided by the present application, by disposing a filter film above a photosensitive region of an optical fingerprint sensor, a base material in a conventional filter may be eliminated, and the optical fingerprint sensor or a light path directing structure is used as the base material of the filter film. Therefore, a thickness of the base material may can be reduced in a fingerprint identification apparatus, so that a distance between the light path directing structure and a display screen can be reduced, which is beneficial to improvement of an imaging effect of the light path directing structure.

DESCRIPTION OF EMBODIMENTS

The technical solutions in embodiments of the present application will be described hereinafter with reference to the accompanying drawings.

It should be understood that embodiments of the present application may be applied to an optical fingerprint system, including but not limited to an optical fingerprint identification system and a medical diagnostic product based on optical fingerprint imaging. The embodiments of the present application are only described by taking an optical fingerprint system as an example, which should not constitute any limitation to the embodiments of the present application, and the embodiments of the present application are also applicable to other systems using an optical imaging technology or the like.

As a common application scene, an optical fingerprint system provided by the embodiments of the present application can be applied to a smart phone, a tablet computer and another mobile terminal having a display screen or another terminal device; and more particularly, in the foregoing terminal devices, a fingerprint identification apparatus may specifically be an optical fingerprint apparatus, which may be disposed in a partial area or an entire area below a display screen, thereby forming an under-screen (under-display) optical fingerprint system. Alternatively, the fingerprint identification apparatus may be partially or entirely integrated into the interior of the display screen of the terminal device to form an in-screen (in-display) optical fingerprint system.

Figure 1:
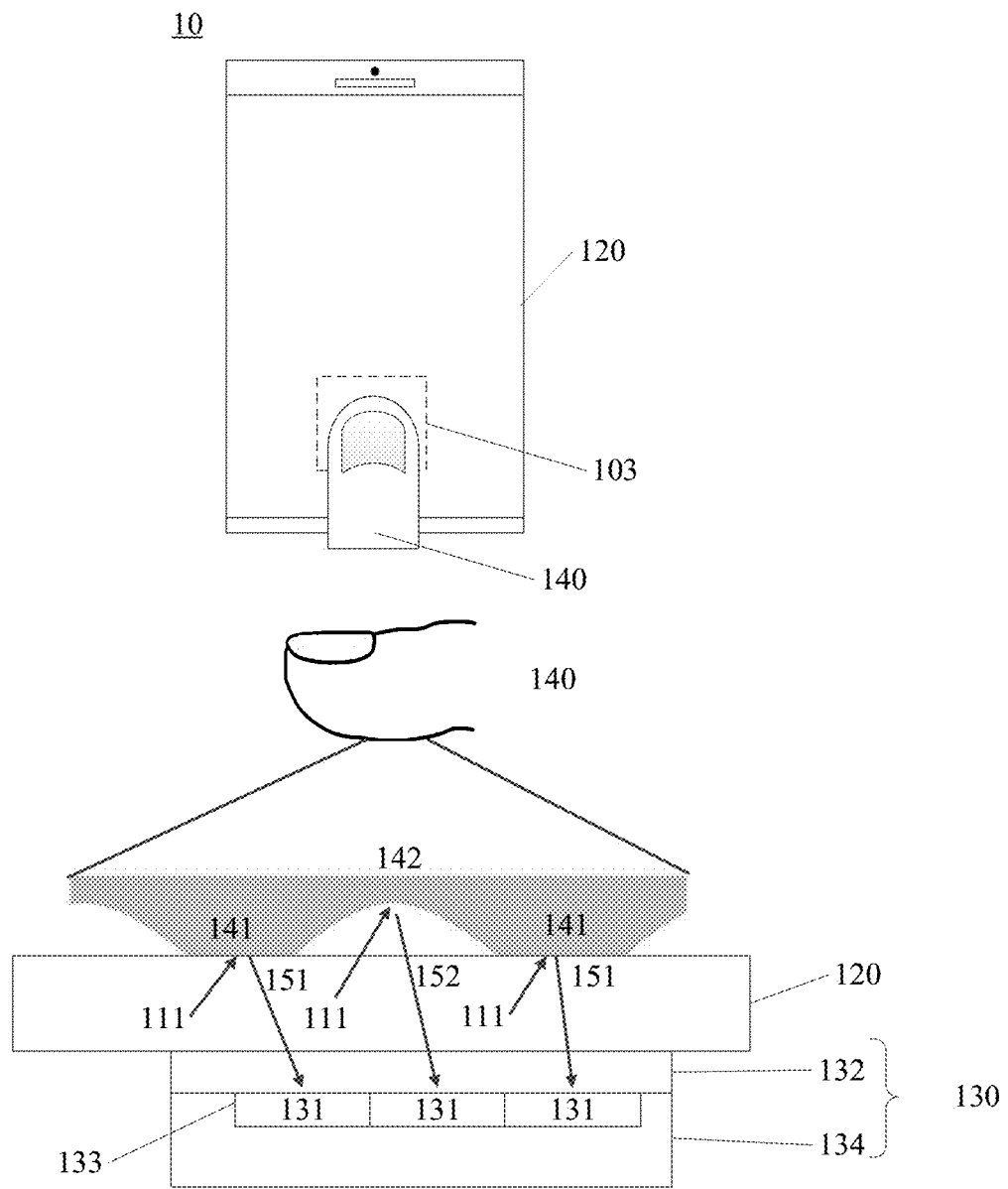
FIG. 1 is a schematic structural diagram of an electronic device used in an embodiment of the present application.

FIG. 1 illustrates a schematic structural diagram of a terminal device applicable to an embodiment of the present application. A terminal device 10 includes a display screen 120 and an optical fingerprint apparatus 130, where the optical fingerprint apparatus 130 is disposed in a partial area under the display screen 120. The optical fingerprint apparatus 130 includes an optical fingerprint sensor including a sensing array 133 having a plurality of optical sensing units 131, and a region where the sensing array is located or its sensing region is a fingerprint detecting region 103 of the optical fingerprint apparatus 130. As shown in FIG. 1, the fingerprint detecting region 103 is located within a display region of the display screen 120. In an alternative embodiment, the optical fingerprint apparatus 130 may also be disposed at other positions, such as a side of the display screen 120 or an edge non-light transmitting region of the terminal device 10, and an optical signal of at least part of the display region of the display screen 120 is directed to the optical fingerprint apparatus 130 through a light path design, such that the fingerprint detecting region 103 is actually located in the display region of the display screen 120.

It should be understood that an area of the fingerprint detecting region 103 may be different from an area of the sensing array of the optical fingerprint apparatus 130. For example, the area of the fingerprint detecting region 103 of the optical fingerprint apparatus 130 may be larger than the area of the sensing array of the optical fingerprint apparatus 130 through for example, a lens imaging light path design, a reflective folding light path design or other light path designs such as light convergence or reflection. In other alternative implementation manners, if the light path is directed in a manner of, for example, light collimation, the area of the fingerprint detecting region 103 of the optical fingerprint apparatus 130 may also be designed to be substantially identical with the area of the sensing array of the optical fingerprint apparatus 130.

Therefore, when a user needs to unlock the terminal device or perform other fingerprint verification, a fingerprint input may be implemented merely by pressing a finger on the fingerprint detecting region 103 located on the display screen 120. Since fingerprint detection can be implemented in the screen, there is no need to reserve space for a front surface of the terminal device 10 in the foregoing structure to set a fingerprint button (such as Home button), so that a full screen scheme can be adopted; that is, the display region of the display screen 120 can be substantially extended to the entire front surface of the terminal device 10.

As an alternative implementation manner, as shown in FIG. 1, the optical fingerprint apparatus 130 includes a light detecting portion 134 and an optical component 132. The light detecting portion 134 includes the sensing array, a readout circuit and other auxiliary circuits electrically connected to the sensing array, and may be fabricated in a die (Die) by a semiconductor process such as an optical imaging chip or an optical fingerprint sensor. The sensing array is specifically a photo detector array including a plurality of photo detectors distributed in an array, and the photo detectors may be used as the optical sensing units as described above. The optical component 132 may be disposed above the sensing array of the light detecting portion 134, and may specifically include a filter layer, a light directing layer or a light path directing structure, and other optical elements, the filter layer may be used to filter out ambient light passing through a finger, and the light directing layer or light path directing structure is mainly used to direct reflected light reflected from a finger surface to the sensing array for optical detection.

In a specific implementation, the optical component 132 and the light detecting portion 134 may be encapsulated in the same optical fingerprint member. For example, the optical component 132 may be encapsulated in the same optical fingerprint chip with the optical detecting portion 134, or the optical component 132 may be disposed outside the chip where the optical detecting portion 134 is located, for example the optical component 132 is attached above the chip, or some components of the optical component 132 are integrated into the chip.

The light directing layer or light path directing structure of the optical component 132 has various implementations, for example, the light directing layer may be specifically a collimator layer made of a semiconductor silicon wafer, which has a plurality of collimating units or micro-hole arrays, and the collimating units may be holes. Light that is in the reflected light reflected from the finger and is vertically incident to the collimating unit may pass through the hole and be received by the optical sensing unit below it. However, light with an excessive incident angle is attenuated through multiple reflections inside the collimating unit, therefore, each optical sensing unit may basically only receive the reflected light reflected from the fingerprint directly above the optical sensing unit, and thus the sensing array may detect a fingerprint image of the finger.

In another embodiment, the light directing layer or the light path directing structure may also be an optical lens layer having one or more lens units, for example, a lens group composed of one or more aspheric lenses, for converging reflected light reflected from the finger to the sensing array of the light detecting portion 134 below it, so that the sensing array may perform imaging based on the reflected light so as to obtain the fingerprint image of the finger. Optionally, the optical lens layer may be provided with a pinhole in a light path of the lens unit, and the pinhole may cooperate with the optical lens layer to expand the field of view of the optical fingerprint apparatus, to improve a fingerprint imaging effect of the optical fingerprint apparatus 130.

In other embodiments, the light directing layer or the light path directing structure may also specifically adopt a micro-lens layer having a micro-lens array constituted by a plurality of micro-lenses, which may be formed above the sensing array of the light detecting portion 134 by a semiconductor growth process or other processes, and each micro-lens may correspond to one of the sensing units in the sensing array respectively. Furthermore, other optical film layers such as a medium layer or a passivation layer, may be formed between the micro-lens layer and the sensing unit, and more specifically, a light shielding layer having a micro-hole may also be formed between the micro-lens layer and the sensing unit, where the micro-hole is formed between the corresponding micro-lens and the sensing unit, and the light shielding layer may shield optical interference between adjacent micro-lenses and the sensing units, such that light corresponding to the sensing unit is converged to the interior of the micro-hole through the micro-lens and is transmitted to the sensing unit via the micro-hole for optical fingerprint imaging. It should be understood that several implementations of the forgoing light path directing structure may be used alone or in combination, for example, a micro-lens layer may be further disposed under the collimator layer or the optical lens layer. Certainly, when the collimator layer or the optical lens layer is used in combination with the micro-lens layer, the specific laminated structure or light path may require to be adjusted according to actual needs.

As an optional embodiment, the display screen 120 may adopt a display screen with a self-emitting display unit, for example, an organic light-emitting diode (OLED) display screen or a micro light-emitting diode (Micro-LED) display screen. In an example of an OLED display screen, the optical fingerprint apparatus 130 can use a display unit (that is, an OLED light source) of the OLED display screen 120 located in the fingerprint detecting region 103 as an excitation light source for optical fingerprint detection. When a finger 140 is pressed against the fingerprint detecting region 103, the display screen 120 emits a beam of light 111 to the target finger 140 above the fingerprint detecting region 103, and the light 111 is reflected by a surface of the finger 140 to form reflected light or form scattered light after scattering inside the finger 140. In related patent applications, the reflected light and scattered light are collectively referred to as reflected light for convenience of description. Since a ridge and a valley of a fingerprint have different light reflecting capabilities, reflected light 151 from the ridge of the fingerprint and reflected light 152 from the valley of the fingerprint have different light intensities. After passing through the optical component 132, the reflected light is received by the sensing array 134 in the optical fingerprint apparatus 130 and converted into a corresponding electrical signal, that is, a fingerprint detecting signal; and fingerprint image data may be obtained based on the fingerprint detecting signal, and fingerprint matching verification may be further performed, thereby implementing an optical fingerprint identification function at the terminal device 10.

In other embodiments, the optical fingerprint apparatus 130 may also use an internal light source or an external light source to provide an optical signal for fingerprint detection. In this case, the optical fingerprint apparatus 130 may be applied to a non-self-emitting display screen, such as a liquid crystal display screen or other passive light-emitting display screens. In an example of a liquid crystal display screen having a backlight module and a liquid crystal panel, in order to support under-screen fingerprint detection of the liquid crystal display screen, an optical fingerprint system of the terminal device 10 may further include an excitation light source for optical fingerprint detection. The excitation light source may specifically be an infrared light source or a light source of non-visible light with a specific wavelength, which may be disposed under the backlight module of the liquid crystal display screen or disposed in an edge region under a protective cover of the terminal device 10. The optical fingerprint apparatus 130 may be disposed under the liquid crystal panel or the edge region of the protective cover, and by being directed over a light path, light for fingerprint detection may reach the optical fingerprint apparatus 130. Alternatively, the optical fingerprint apparatus 130 may also be disposed under the backlight module, and the backlight module allows the light for fingerprint detection to pass through the liquid crystal panel and the backlight module and reach the optical fingerprint apparatus 130 by providing a via hole on film layers such as a diffusion sheet, a brightening sheet, a reflection sheet or the like, or by performing other optical designs. When the optical fingerprint apparatus 130 uses an internal light source or an external light source to provide an optical signal for fingerprint detection, a detection principle is consistent with the foregoing description.

It should be understood that, in a specific implementation, the terminal device 10 further includes a transparent protective cover; the cover may be a glass cover or a sapphire cover, which is located above the display screen 120 and covers a front surface of the terminal device 10. Therefore, in an embodiment of the present application, the so-called finger being pressed against the display screen 120 actually refers to the finger being pressed against the cover above the display screen 120 or a surface of a protective layer covering the cover 110.

On the other hand, in some embodiments, the optical fingerprint apparatus 130 may only include one optical fingerprint sensor, and in this case, the fingerprint detecting region 103 of the optical fingerprint apparatus 130 has a smaller area and a fixed position, and therefore, when an fingerprint input is performed, the user needs to press the finger at a specific position of the fingerprint detecting region 103, otherwise the optical fingerprint apparatus 130 may not be able to capture the fingerprint image, thereby resulting in poor user experience. In other alternative embodiments, the optical fingerprint apparatus 130 may specifically include a plurality of optical fingerprint sensors which may be disposed under the display screen 120 side by side in a splicing manner, and sensing regions of the plurality of optical fingerprint sensors collectively constitute the fingerprint detecting region 103 of the optical fingerprint apparatus 130. In other words, the fingerprint detecting region 103 of the optical fingerprint apparatus 130 may include a plurality of sub-regions, each sub-region corresponding to a sensing region of one of the optical fingerprint sensors, so that a fingerprint detecting region 103 of the optical fingerprint module 130 may be extended to a main region of a lower portion of the display screen, that is, it is extended to a generally pressed region by the finger, thereby achieving a blind pressing type of a fingerprint input operation. Alternatively, when the number of the optical fingerprint sensors is sufficient, the fingerprint detecting region 130 may also be extended to a half of the display region or even the entire display region, thereby achieving half-screen or full-screen fingerprint detection.

Figure 2:
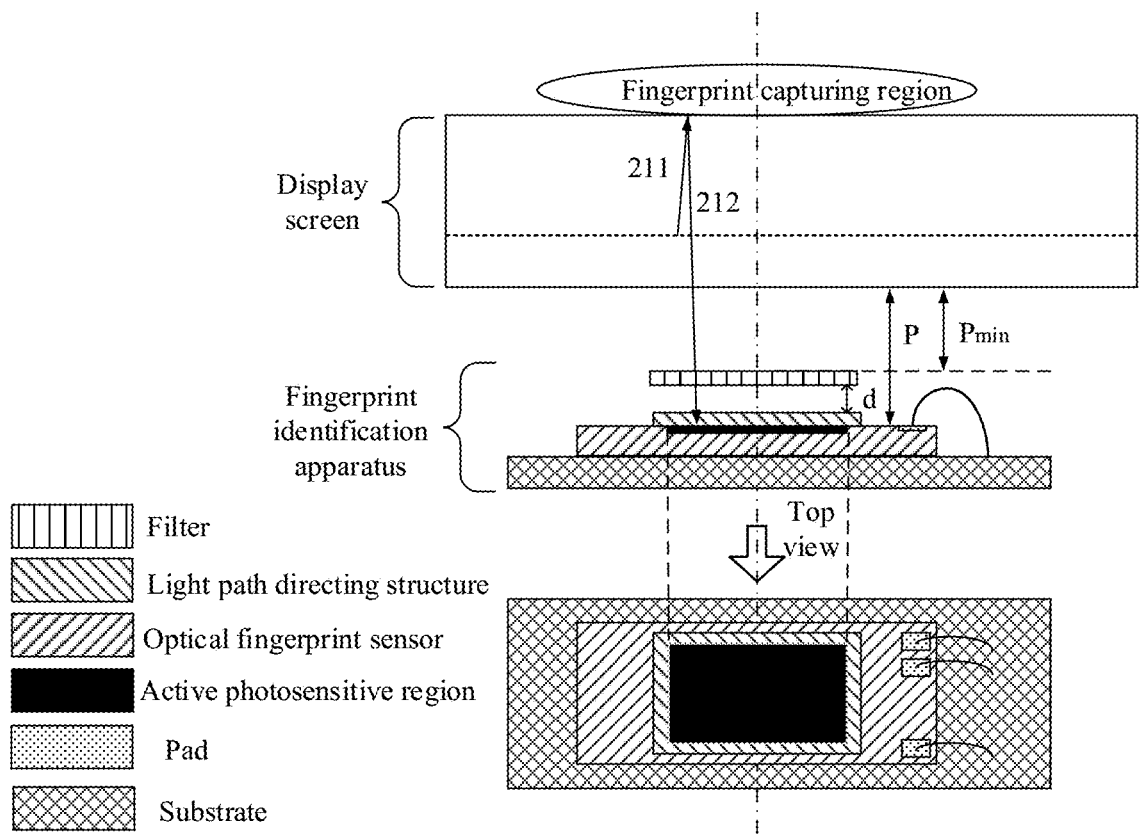
FIG. 2 is a schematic structural diagram of a fingerprint identification apparatus provided by an embodiment of the present application.

FIG. 2 illustrates a schematic structural diagram of a fingerprint identification apparatus, and the fingerprint identification apparatus may also refer to the optical fingerprint apparatus described above. The fingerprint identification apparatus may include at least one optical fingerprint sensor, the optical fingerprint sensor may be disposed under a display screen and configured to receive an optical signal reflected by a finger on the display screen, and the optical signal reflected by the finger may be referred to as a fingerprint detecting signal for generating fingerprint information of the finger.

The display screen may be a self-emitting display screen such as an OLED display screen, or may be a non-self-emitting display screen such as a liquid crystal display (LCD) screen.

In an example of FIG. 2, the display screen shown in FIG. 2 is an OLED display screen. A self-emitting unit in the display screen may emit an optical signal 211, and when the finger is pressed against a fingerprint capturing region on a surface of the display screen, light emitted by the light-emitting unit may illuminate a fingerprint region of the finger. After reaching the finger, the optical signal 211 may be reflected or scattered on a surface of the finger to form reflected light or scattered light returning to the optical fingerprint sensor, which is collectively referred to as reflected light 212 hereinafter for convenience of description. The reflected light 212 may be received by the optical fingerprint sensor under the display screen for fingerprint capturing. The optical fingerprint sensor may include an image sensor having a photosensitive array and being capable of receiving the optical signal 212, and the optical signal may be used to generate fingerprint image information of the finger to complete capturing of a fingerprint image.

The optical fingerprint identification apparatus may further include a light optical directing structure, and the light path directing structure is configured to transmit the optical signal to the optical fingerprint sensor so that the optical fingerprint sensor can detect the fingerprint information of the finger. The light path directing structure may be disposed above the optical fingerprint sensor. Specifically, the optical fingerprint sensor may include an active photosensitive region (or a photosensitive region for short), and the light path directing structure may be disposed above the active photosensitive region of the optical fingerprint sensor. The active photosensitive region may specifically be a region on a surface of the optical fingerprint sensor that corresponds to a sensing array of the optical fingerprint sensor, that is, the active photosensitive region is provided with a plurality of sensing units; and in other words, the active photosensitive region may be a region where the optical fingerprint sensor is used to perform fingerprint identification.

Figure 11:
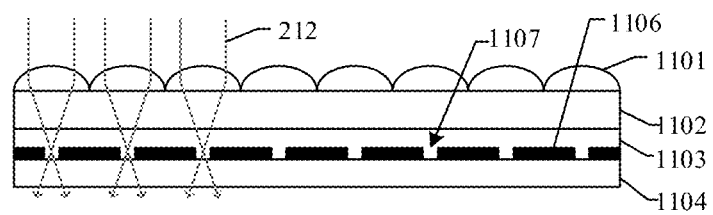
FIG. 11 is a schematic diagram of an embodiment of a light path directing structure of a fingerprint identification apparatus provided by an embodiment of the present application.

As an embodiment, as shown in FIG. 11, the light path directing structure may include a micro-lens layer 1101 and a micro-hole layer 1106, the micro-lens layer 1101 includes a micro-lens array constituted by a plurality of micro-lenses arranged in an array, the micro-hole layer 1106 may include a plurality of micro-holes formed in at least one light shielding layer, and the plurality of micro-holes form a micro-hole array; where the micro-hole array is disposed under the micro-lens array. Optionally, there may be a one-to-one correspondence relationship between the micro-lenses and the micro-holes, and a micro-lens and a micro-hole corresponds to one of sensing units 1202 of the optical fingerprint sensor, respectively. The micro-lenses may converge the optical signal 212 reflected from the finger to the micro-holes and further transmit the optical signal to corresponding sensing units through the micro-holes.

As an optional implementation manner, the micro-lenses, the micro-holes and the sensing units may be aligned in a direction perpendicular to a surface of the optical fingerprint sensor, as shown in FIG. 11, and in this case, the micro-lenses cooperate with the micro-holes to transmit the optical signal 212 in a vertical direction to the sensing units under the micro-lenses and the micro-holes. Alternatively, the micro-lenses, the micro-holes and the sensing units may be aligned in a direction having a certain tilt angle with respect to a surface of the optical fingerprint sensor, and in this case, the micro-lenses cooperate with the micro-holes to transmit an optical signal incident at a tilt angle to the corresponding sensing units.

Further, the light path directing structure may further include other optical filter films, such as a passivation layer 1102, a first transparent medium layer 1103 and a second transparent medium layer 1104 shown in FIG. 11, where the first transparent medium layer 1103 may be formed above the micro-hole layer 1106 and at least partially fill the micro-holes; and the passivation layer 1102 may be formed between the micro-lens layer 1101 and the first medium layer 1103, and the second transparent medium layer 1104 is formed under the micro-hole layer 1106. On the other hand, a buffer layer may be selectively formed among the micro-lens layer 1101, the passivation layer 1102, the first transparent medium layer 1103 and the second transparent medium layer 1104 according to needs, and a flat layer may be formed on a surface of the micro-lens layer 1101.

On the other hand, the light path directing structure may be disposed above the optical fingerprint sensor as an independent component, or may be directly grown above the optical fingerprint sensor by a semiconductor manufacturing process. In other words, the light path directing structure may be integrated into the optical fingerprint sensor to form an integrated optical sensor chip. The use of this structure can reduce the overall thickness of the optical fingerprint apparatus on the one hand, is beneficial to mutual alignment among the micro-lenses, the micro-holes and the sensing units and improvement of product yield, and is also beneficial to forming of a large-area optical fingerprint apparatus.

As an alternative embodiment, the light path directing structure may also be a collimator, the collimator may be a collimating through hole array with a certain depth-to-width ratio, and collimating through holes of the collimating through hole array may allow an optical signal in a direction consistent with an extension direction of the through holes to pass, and attenuate an optical signal having a certain angle with respect to the collimating through holes. For example, the collimating through holes of the collimator may be perpendicular to a surface of the collimator, and in this case, the collimating through holes may allow an optical signal reflected by the finger that is vertically incident to the collimator to pass and be received by the optical fingerprint sensor under the collimator. Alternatively, an extension direction of the collimating through holes of the collimator may have a certain tilt angle with respect to a surface of the collimator, and in this case, the collimator may allow an optical signal having the foregoing tile angle to pass and be transmitted to corresponding sensing units of the optical fingerprint sensor, and attenuate an optical signal having a tilt angle that is inconsistent with the foregoing tilt angle.

In addition, the fingerprint identification apparatus may further include a filter, the filter may be disposed above the light path directing structure and configured to filter out ambient light in the optical signal reflected by the finger or other interference light, so as to select a required light wavelength and reduce interference of the ambient light to the fingerprint image. In a specific embodiment, the filter may specifically include an infrared-cut filter (IR-cut Filter).

The fingerprint identification apparatus shown in FIG. 2 mainly uses the light path directing structure (such as the foregoing micro-lenses or collimator) for imaging, and the imaging effect using the light path directing structure is related to an optical path between the light path directing structure and the finger. The optical path may refer to a distance required for the optical signal reflected by the finger to reach the light path directing structure. The longer the optical path between the light path directing structure and the finger is, the more series light diffusion is, and the worse the imaging effect of the light path directing structure is. Therefore, in order to improve the imaging effect of the light path directing structure, it is necessary to reduce the optical path between the light path directing structure and the finger.

Generally, for a display screen with a determined thickness, the optical path between the light path directing structure and the finger mainly depends on a distance between a lower surface of the display screen and the light path directing structure, which is denoted by P.

In the architecture shown in FIG. 2, $P=P_{min}+d+T/n$.

$P_{min}$ represents a minimum distance between a lower surface of the display screen and an upper surface of the filter, and the minimum distance $P_{min}$ is a safety gap that is necessarily reserved for structural assembly. In other words, $P_{min}$ is a minimum installation gap reserved for installation of the filter, and has a minimum value of technological limits.

d is a distance from a lower surface of the filter to an upper surface of the light path directing structure, this distance is also a safety gap that is necessarily reserved for structural assembly, and has a minimum value of technological limits.

T represents a thickness of the filter, n represents an equivalent refractive index of the filter, and thus, an equivalent optical path of the filter is T/n.

In summary, in the architecture shown in FIG. 2, due to limitations of a process, a value of P may not be further reduced, and a greater value of P may affect the imaging effect of the collimator. Therefore, how to design a fingerprint identification apparatus to improve the imaging effect of the light path directing structure becomes an urgent problem.

In addition, if the value of P is greater, the thickness of the entire fingerprint identification apparatus will be greater, which is not conducive to saving of the size and space.

An embodiment of the present application provides a fingerprint identification apparatus, which can reduce an optical path between the light path directing structure and the finger and improve the imaging effect of the light path directing structure.

By analyzing the structure of the filter in the embodiment of the present application, it is obtained that the purpose of reducing the optical path between the light path directing structure and the finger can be achieved by omitting a base material of the filter. The technical solution provided by the embodiment of the present application will be described below in detail.

Figure 3:
FIG. 3 is a schematic structural diagram of another fingerprint identification apparatus provided by an embodiment of the present application.

FIG. 3 is a schematic structural diagram of a typical filter. Generally, the structure of a filter includes a base material and a plating film. The base material may be a glass sheet, a crystal sheet or a thin film sheet, and is mainly used as a carrier of the plating film. The base material is usually relatively thick, and its thickness generally exceeds 100 μm, that is, T is greater than 100 μm. The plating film is a core of the filter, and used to complete an effect of light wave filtering. The plating film is usually very thin, only 1~5 μm.

Given that the base material of the filter is merely used as a carrier of the plating film, the base material of the filter does not play a major role in the process of light wave filtering, and the base material also takes up a great thickness. In summary, the embodiment of the present application provides a fingerprint identification apparatus, a base material of a filter can be omitted, a plating film is directly plated on a surface of the optical fingerprint sensor or the light path directing structure, and the optical fingerprint sensor or the optical path directing structure is used as a carrier of the plating film such that the same effect of light wave filtering can be achieved.

The fingerprint identification apparatus in that the base material of the filer is omitted can reduce a distance between the light path directing structure and a lower surface of the display screen, that is, the optical path between the light path directing structure and the finger can be reduced, and the imaging effect of the light path directing structure is improved. In addition, after the base material of the filter is omitted, the thickness of the fingerprint identification apparatus can be reduced, which is beneficial to saving of the size and space.

Figure 4:
FIG. 4 is a schematic structural diagram of another fingerprint identification apparatus provided by an embodiment of the present application.

FIG. 4 is a schematic diagram of a fingerprint identification apparatus provided by an embodiment of the present application. The fingerprint identification apparatus includes an optical fingerprint sensor 320, the optical fingerprint sensor 320 includes a photosensitive region 321, and the photosensitive region 321 is plated with a filter film 310. The filter film 310 may refer to the plating film described above.

The filter film 310 may filter an optical signal reaching the photosensitive region 321 to filter out interference light entering the photosensitive region 321, such as ambient light or other optical signals that interfere with a fingerprint detecting signal, and only make an optical signal with a specific wave band (that is, an optical signal with a wave band corresponding to the fingerprint detecting signal) reach the photosensitive region 321 of the optical fingerprint sensor 320. For example, the filter film 310 may be an infrared-cut filter film, which may filter out optical signals with an infrared wave band, or simultaneously filter out some red light waves.

The optical fingerprint senor plated with the filter film may be used as an optical fingerprint sensor for capturing of a fingerprint image, and also be used as a base material of the filter film to bear the filter film and form a filter for filtering out interference light together with the filter film to complete the effect of light wave filtering. The filter film is integrated on the optical fingerprint sensor, which can omit the base material of the filer and is beneficial to reduction of the thickness of the fingerprint identification apparatus.

The filter film may be plated on the photosensitive region of the optical fingerprint sensor, or may be plated on the entire surface of the optical fingerprint sensor, or may be plated on a region slightly larger than the photosensitive region. In other words, the filter film may at least partially cover a part of sensing units of the photosensitive region of the optical fingerprint sensor by means of plating. On the other hand, according to actual needs, a buffer layer or a medium layer may be disposed between the filter film and the optical fingerprint sensor to ensure a good combination between the two so as to ensure the filtering effect, which is not specifically limited in this embodiment of the present application.

For a conventional optical fingerprint sensor, a photosensitive surface of a sensor faces a front side of the fingerprint sensor or faces an upper surface of the fingerprint sensor. In this case, a filter film may be plated on the front side of the optical fingerprint sensor, the optical fingerprint sensor is used as a base material of the filter film to filter out ambient light in an optical signal reflected by a finger and achieve the effect of light wave filtering.

The fingerprint identification apparatus may further include the light path directing structure as described above, and the light path directing structure may be disposed on the filter film. The light path directing structure may be used to direct the optical signal reflected by the finger to the photosensitive region.

Figure 5:
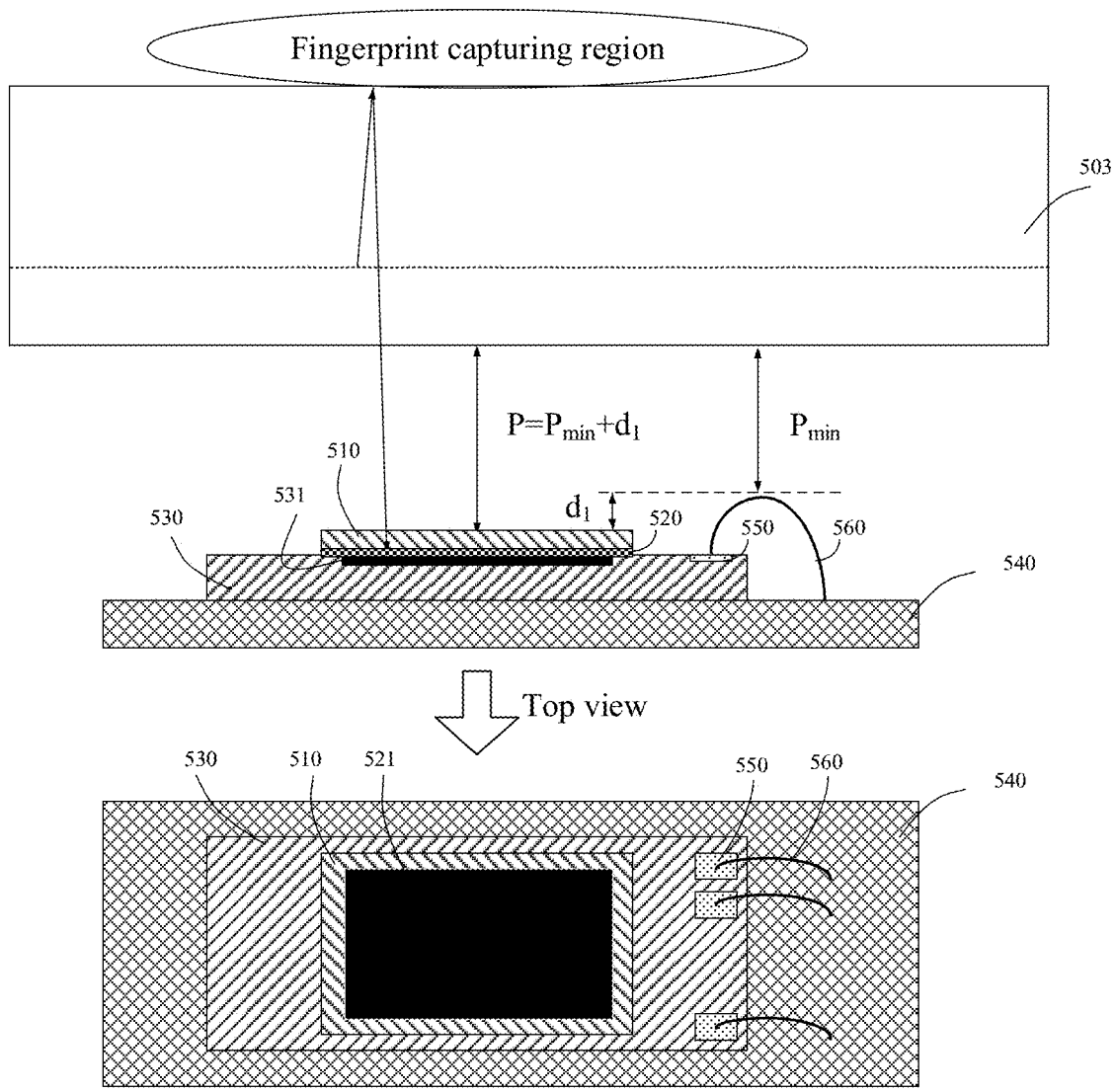
FIG. 5 is a schematic structural diagram of another fingerprint identification apparatus provided by an embodiment of the present application.

As shown in FIG. 5, a filter film 520 of the filter may be directly manufactured on a surface of an optical fingerprint sensor 530. For example, the filter film 520 may be disposed on a photosensitive area 531 of the optical fingerprint sensor 530. In this way, the same effect of light wave filtering can be achieved, and a thickness of a base material of the filter is omitted. A light path directing structure 510 may adopt the structure shown in FIG. 11 or a structure of a collimator, and may be grown on an upper surface of the filter film 520 by a semiconductor manufacturing process. In this case, the light path directing structure 510, the filter film 520 and the optical fingerprint sensor 530 may be integrated into a same chip; or the light path directing structure 510 may be placed on the upper surface of the filter film 520 as an independent component to filter an optical signal reflected by the finger.

When the light path directing structure shown in FIG. 11 is adopted, the second transparent medium layer may be formed above the filter film 520, and a buffer layer or other medium layers or an optical film may be disposed between the second transparent medium layer and the filter film according to needs.

The surface of the optical fingerprint sensor 530 may be further provided with a first pad 550 connected with a substrate 540. The first pad 550 may also be referred to as a soldering pad or a bonding area. An input-output pad (10 pad) may be disposed on the first pad 550, and used to implement transmission of internal signals of the optical fingerprint sensor 530 and external signals.

The substrate 540 may be a circuit board, such as a flexible printed circuit (FPC), and the optical fingerprint sensor 530 may be soldered to the substrate 540 through the first pad 50 and implement electrical interconnection and signal transmission with other peripheral circuits or other elements of the electronic device through the substrate 540.

The connection method of the first pad 550 and the substrate 540 is usually a connection method of using a lead wire. For example, the pad is connected to the substrate by means of wire bonding, as shown in FIG. 5. Certainly, the first pad 550 may also be connected to the substrate in other ways, which is not limited in this embodiment of the present application.

In the architecture shown in FIG. 5, a distance P between an upper surface of the light path directing structure 510 and a lower surface of a display screen 503 is: $P=P_{min}+d_1$.

$P_{min}$ represents a distance between an arc top of a lead wire 560 and the lower surface of the display screen 503, and this $P_{min}$ is also a minimum safety gap on the structural assembly. $d_1$ represents a distance between the arc top of the lead wire 560 and the upper surface of the light path directing structure 510.

The arc height of the lead wire 560 (or bonding wire) connected with the substrate 540 needs to be usually 100 μm, that is, the arc top of the lead wire 560 is usually higher than the position of the first pad 550 on the optical fingerprint sensor 530 by 100 μm. The thickness of the light path directing structure 510 integrated on the surface of the optical fingerprint sensor 530 is usually only 20 μm. Therefore, the arc top of the lead wire 560 is higher than the upper surface of the collimator 510 by a distance of $d_1$.

Obviously, in a case that the reserved safety gap $P_{min}$ is the same, the value of $d_1$ is less than the value of (d+T/n). Therefore, in this architecture, a minimum value of the distance between the light path directing structure 510 and the display screen 503 is less than a value of the distance between the light path directing structure and the display screen in the architecture shown in FIG. 2.

Therefore, the technical solution provided by the embodiment of the present application can reduce the distance between the display screen 503 and the light path directing structure 510 and improve the imaging effect of the light path directing structure 510. In addition, the distance between the light path directing structure 510 and the display screen 503 is reduced, which is beneficial to reduction of the overall size of the fingerprint identification apparatus and saving of the size and space.

In addition, an embodiment of the present application further provides another fingerprint identification apparatus, which can further reduce the distance between the light path directing structure and the display screen.

According to the fingerprint identification apparatus shown in FIG. 5, there is the distance of $d_1$ between the light path directing structure 510 and the display screen 503 due to the height of the arc top of the lead wire 560. Another fingerprint identification apparatus provided by the embodiment of the present application can further reduce the distance between the light path directing structure and the display screen.

Figure 6:
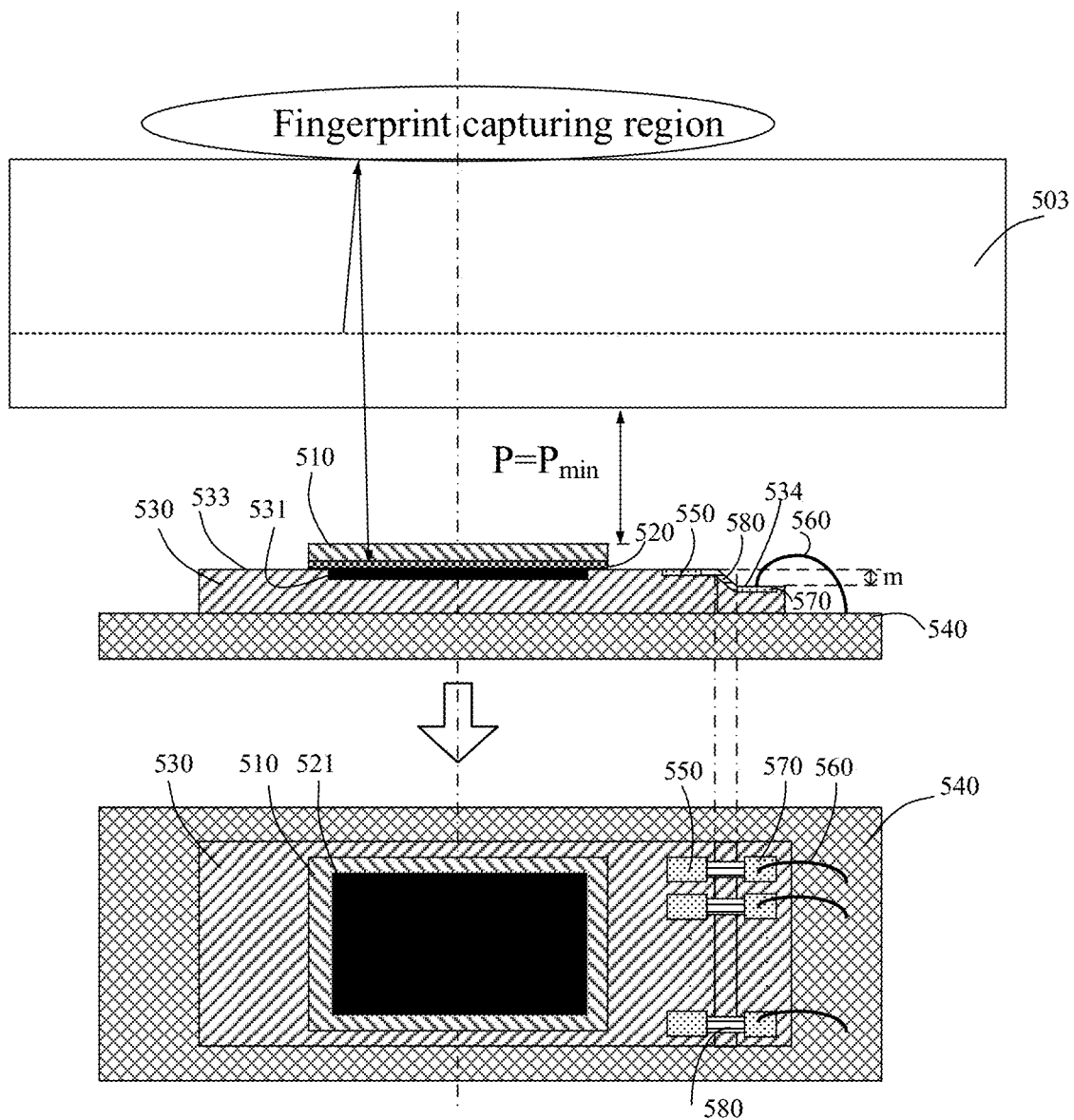
FIG. 6 is a schematic structural diagram of another fingerprint identification apparatus provided by an embodiment of the present application.

As shown in FIG. 6, the optical fingerprint sensor 530 is further provided with a trench (trench), and a surface 534 of the trench is lower than an upper surface 533 of the optical fingerprint sensor 530. In other words, there is a difference m in height between the surface 534 of the trench and the upper surface of the optical fingerprint sensor 530. Specifically, a trench may be cut on the surface of the optical fingerprint sensor 530 by adopting a trench process, and the surface 534 of the trench is lower than the upper surface 533 of the optical fingerprint sensor 530 by a height of m. The trench may be a groove cut on the surface of the optical fingerprint sensor 530 or a step cut on the surface of the optical fingerprint sensor 530, and a surface of the groove or the step is lower than the upper surface of the optical fingerprint sensor 530. A depth of the trench may be determined according to actual needs. As an optional embodiment, the difference in height between the surface 534 of the trench and the upper surface of the optical fingerprint sensor 530 may be greater than or equal to 30 μm.

The surface 534 of the trench is provided with a pad 570 connected with the substrate 540, and the pad 570 may be connected to the substrate 540 by means of wire bonding. In this way, since the position of the pad 570 on the surface of the trench is lower than the position of the first pad 550 on the upper surface of the sensor shown in FIG. 5 by a height of m, the distance between the arc top of the lead wire 560 and the upper surface of the light path directing structure 510 in this embodiment is less than the distance between the arc top of the lead wire and the upper surface of the light path directing structure in FIG. 5 by m in a case that the distance between the arc top of the lead wire 560 and the pad is fixed (for example, 100 μm). That is, the distance between the arc top of the lead wire 560 and the upper surface of the light path directing structure 510 is less than $d_1$, so that the distance between the upper surface of the light path directing structure 510 and the lower surface of the display screen becomes $P_{min}+d_1-m$. Therefore, the distance between the upper surface of the light path directing structure 510 and the lower surface of the display screen 503 is further reduced, which can further improve the imaging effect of the light path directing structure 510.

As an implementation manner, the upper surface 533 of the optical fingerprint sensor 530 is provided with an original pad 550, which is referred to as a first pad 550. A trench may be cut at the outside of the first pad 550. A surface of the trench is provided with a new pad 570, which is referred to as a second pad 570. The second pad 570 corresponds to the first pad 550. A conductive layer 580 may be disposed on the surface of the cut trench, and the conductive layer 580 may connect the first pad 550 to the second pad 570 on the trench.

The conductive layer 580 may be a redistribution layer, redistribution may be performed by using a redistribution layer (RDL) process, and the first pad 550 is led to the position of the second pad 570 in the trench through RDL wiring.

Optically, the value of m may be greater than or equal to $d_1$. When m is greater than or equal to $d_1$, the distance between the upper surface of the light path directing structure 510 and the lower surface of the display screen 503 is reduced to $P_{min}$, and $P_{min}$ is a minimum value of technological limits. In this way, the distance between the light path directing structure 510 and the display screen 503 may be minimized, which can further improve the imaging effect of the light path directing structure 510.

As an implementation manner, m may be greater than or equal to 30 μm. However, the subsidence height of 30 μm is only an example, and the embodiment of the present application is not limited thereto.

In order to reduce the distance between the upper surface of the light path directing structure 510 and the lower surface of the display screen 503 to $P_{min}$, the value of the subsidence height m depends on process techniques of wire bonding. If the process of wire bonding requires that a minimum height of the arc top of the lead wire is 50 μm, the value of m may be greater than or equal to 30 μm; or if the process of wire bonding requires that a minimum height of the arc top of the lead wire is 100 μm, the value of m may be greater than or equal to 80 μm. Therefore, the value of the subsidence height m is not specifically limited in the embodiment of the present application, as long as the height of the arc top of the lead wire does not exceed the upper surface of the light path directing structure.

In addition, an embodiment of the present application further provides another fingerprint identification apparatus, which can also implement that the distance between the upper surface of the light path directing structure and the lower surface of the display screen is $P_{min}$.

Figure 7:
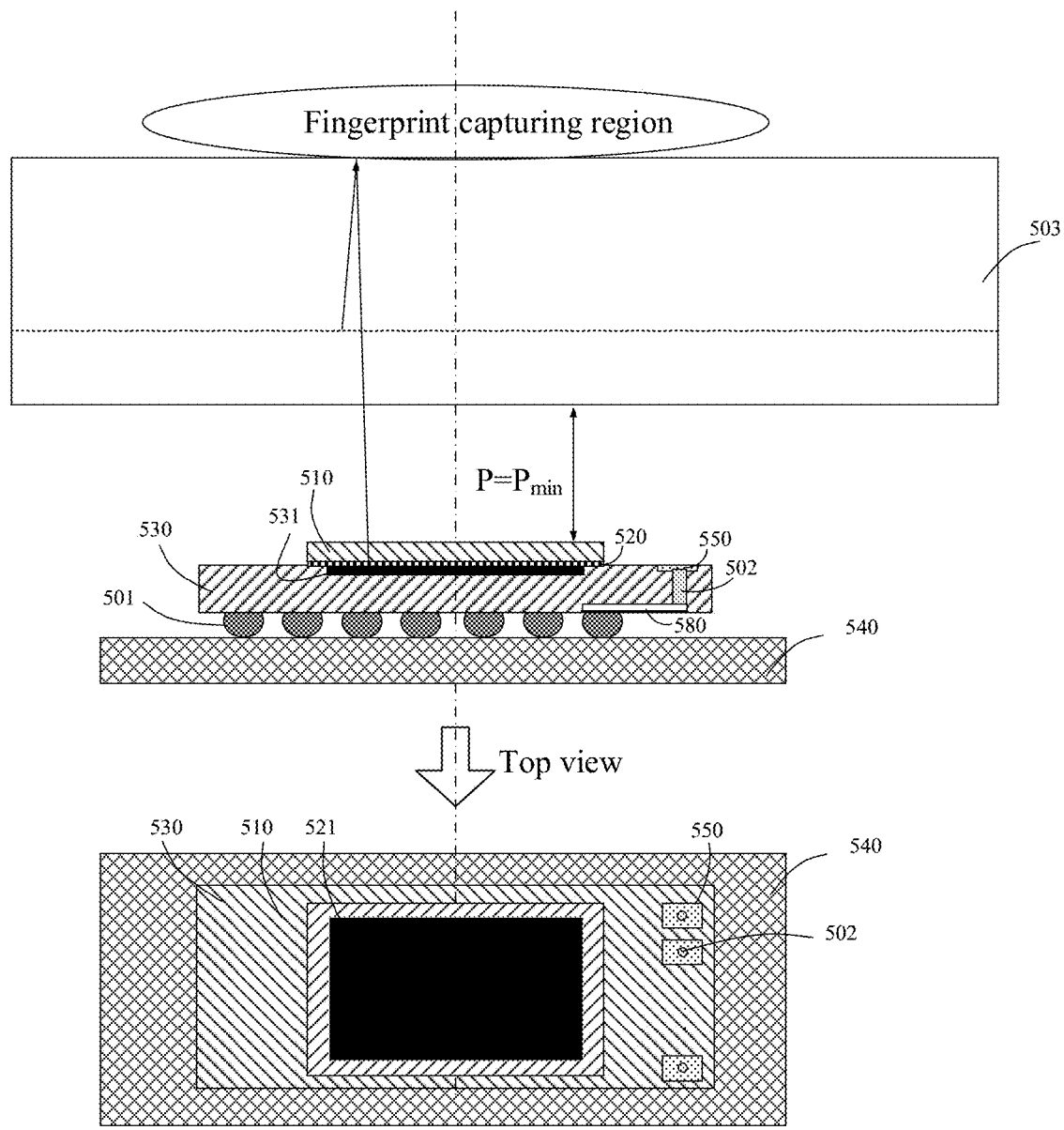
FIG. 7 is a schematic structural diagram of another fingerprint identification apparatus provided by an embodiment of the present application.

As shown in FIG. 7, a through silicon via 502 connected with the substrate 540 may be provided on the first pad 550, and a surface of the through silicon via 502 may be plated with a conductive layer. For example, metal may be plated to make the through silicon via 502 conductive, so that the first pad 550 located on the upper surface of the optical fingerprint sensor 530 may be connected to the lower surface of the optical fingerprint sensor 530. An orifice of the through silicon via 502 on the lower surface of the optical fingerprint sensor 530 may be connected with the substrate 540, so as to implement a connection between the first pad 550 and the substrate 540.

The lower surface of the optical fingerprint sensor 530 may be provided with solder balls 501, and the solder balls 501 may be used as a new soldering area. The solder ball 501 corresponds to the through silicon via 502, that is, the solder ball 501 corresponds to the first pad 550, and each pad corresponds to one solder ball. This process can implement that the first pad 550 on the upper surface of the optical fingerprint sensor 530 is leaded to the solder ball 501 on the lower surface, and then implement the connection between the optical fingerprint sensor 530 and the substrate 540 by soldering the solder ball 501 to the substrate 540.

As an implementation manner, the solder ball 501 may be disposed at the orifice of the through silicon via 502, and a corresponding solder ball 501 is disposed at an orifice of each through silicon via 502. As another implementation manner, the solder balls 501 are arranged in an array on the lower surface of the optical fingerprint sensor 530, then, a conductive layer 580 may be manufactured on the lower surface of the optical fingerprint sensor 530, and the orifice of the through silicon via 502 is connected to the corresponding solder ball 501 through the conductive layer 580, so as to implement that the first pad 550 is leaded to a solder ball 501 at a designated position. The conductive layer 580 may be, for example, the redistribution layer manufactured by using the RDL process described above.

Certainly, the solder balls 501 may be distributed not in an array, and may be distributed in another form, as long as a spacing between adjacent solder balls can satisfy a minimum spacing of solder balls.

By redistribution, the position of the through silicon via 502 is connected to the new soldering area, so that the solder balls 501 in the new soldering area meet the requirements of the minimum spacing to avoid a too small distance between adjacent through silicon vias 502 and circuit failure. Therefore, the rearrangement of the positions of the solder balls 501 on the lower surface of the optical fingerprint sensor 530 is particularly suitable for a situation where the positions of the first pads 550 are too dense.

All the first pads 550 on the upper surface of the optical fingerprint sensor 530 may be connected to the solder balls 501 on the lower surface through the through silicon vias 502, and the solder balls 501 on the lower surface may be soldered to the substrate by a surface mount technology (SMT).

Packaging is performed by a through silicon via (TSV) technology, which eliminates a lead wire and can avoid the problem of an excessively high arc top of a lead wire caused by lead packaging. By TSV packaging, that the distance between the upper surface of the light path directing structure 510 and the lower surface of the display screen 503 is $P=P_{min}$ can also be implemented.

The connection method of TSVs is not limited to the architecture shown in FIG. 7. For example, based on the architecture shown in FIG. 6, the packaging method of TSVs is used at the position of the trench, which can also implement that the distance between the upper surface of the light path directing structure and the lower surface of the display screen is $P_{min}$. The process of performing TSV packaging on the surface of the trench is similar to the process of performing TSV packaging on the upper surface of the optical fingerprint sensor, which will not be repeated redundantly here.

The optical fingerprint sensor described above is described by taking a conventional optical fingerprint sensor as an example. A photosensitive surface of the optical fingerprint sensor faces an upper surface of the fingerprint sensor or faces a front side of the fingerprint sensor. This conventional optical fingerprint sensor is applied to any one of the embodiments described above.

Figure 8:
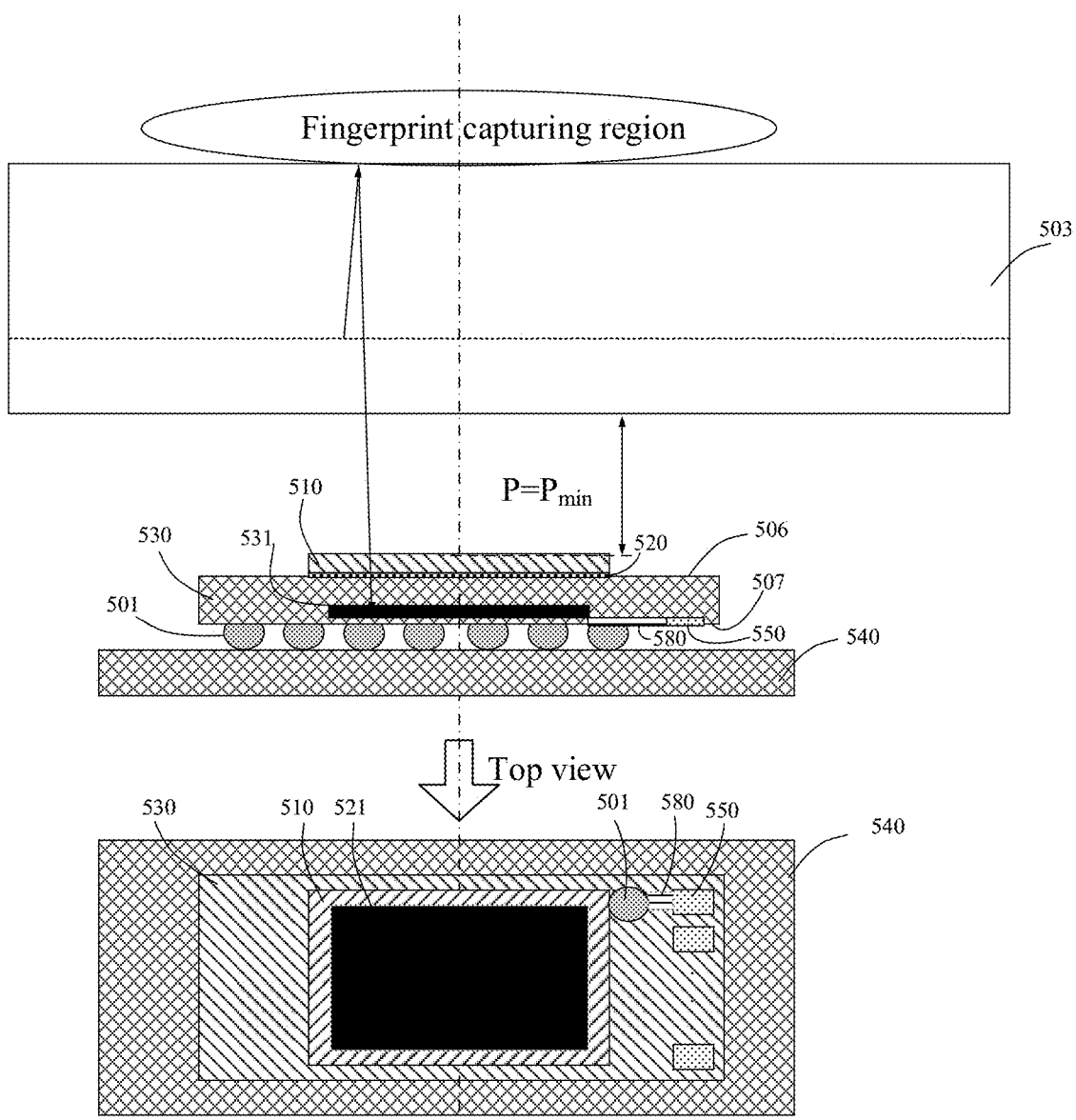
FIG. 8 is a schematic structural diagram of another fingerprint identification apparatus provided by an embodiment of the present application.

In addition, the fingerprint identification apparatus in the embodiment of the present application may also use a backside illumination fingerprint sensor. As shown in FIG. 8, a backside illumination fingerprint sensor 530 indicates that a photosensitive surface 531 of the optical fingerprint sensor faces a lower surface 507 of the backside illumination fingerprint sensor 530. The backside illumination fingerprint sensor 530 may adopt a flip chip packaging technology, that is, the packaging method of a lower surface 507 of the backside illumination fingerprint sensor 530 facing down and facing the substrate 540. A connection between the backside illumination fingerprint sensor 530 and the substrate 540 is implemented by connecting the first pad 550 of the upper surface 507 of the backside illumination fingerprint sensor 530 to the substrate 540.

As shown in FIG. 8, an optical signal reflected by the finger may reach the photosensitive region 531 at the back of the backside illumination fingerprint sensor 530, and the photosensitive region 531 may perform fingerprint identification according to the received optical signal.

Optically, the solder balls 501 may be manufactured at the position of the first pad 550, and the solder balls 501 are soldered to the substrate 540 to implement the connection between the backside illumination fingerprint sensor 530 and the substrate 540. Alternatively, a solder ball array may be manufactured on the front side 507 of the fingerprint sensor 530, the original first pad 550 is connected to a designated solder ball 501 by the RDL process, and the backside illumination fingerprint sensor 530 may be soldered upside down to the substrate 540 through the solder ball array to implement the connection between the backside illumination fingerprint sensor 530 and the substrate 540.

Different from the optical fingerprint sensor of the previous embodiments, a filter film 520 of the backside illumination fingerprint sensor 530 provided by this embodiment may be plated on a back side 506 of the backside illumination fingerprint sensor 530. For example, the filter film 520 may be plated on a sensing region on the back side 506 of the backside illumination fingerprint sensor 530. A collimator 510 may be disposed on the filter film 520. In this way, the distance between the light path directing structure 510 and the display screen 503 may also be minimized, that is, $P=P_{min}$.

Figure 9:
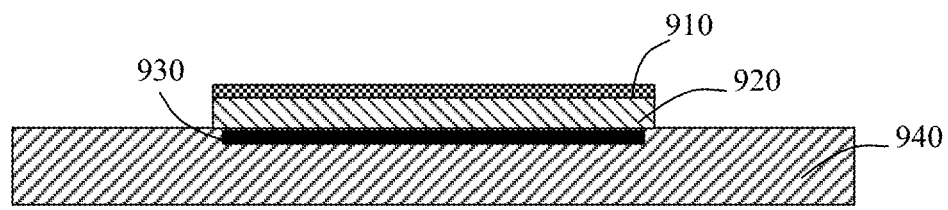
FIG. 9 is a schematic structural diagram of another fingerprint identification apparatus provided by an embodiment of the present application.

The foregoing description is described by an example that the filter film is plated on the surface of the fingerprint sensor, which is not limited in the embodiment of the present application. As shown in FIG. 9, a filter film 910 may also be plated on a surface of a light path directing structure 920, and the light path directing structure 920 is used as a base material of a plating film to achieve the effect of light wave filtering.

For example, the filter film 910 may be plated on an upper surface of the light path directing structure 920. When the light path directing structure shown in FIG. 11 is adopted, the surface of the micro-lens layer may be provided with a flat layer, and the filter film 910 may be plated on a surface of the flat layer; or the filter film 910 may be plated on a lower surface of the collimator 920; and when the light path directing structure shown in FIG. 11 is adopted, the filter film 910 may be specifically plated under the second transparent medium layer.

Similar to the principle of plating the filter film on the surface of the optical fingerprint sensor described above, the filter film is plated on the surface of the light path directing structure, the base material of the filter can be omitted, and a distance between the collimator and the display screen is reduced.

The fingerprint identification apparatus in the embodiment of the present application may include the light path directing structure 920 and an optical fingerprint sensor 940. The surface of the light path directing structure 920 may be plated with the filter film 910, and the light path directing structure 920 may be disposed on a surface of the optical fingerprint sensor 940, for example, on a photosensitive region 930 of the optical fingerprint sensor 940.

The light path directing structure 920 plated with the filter film 910 may filter an optical signal reflected by the finger on the display screen and direct the optical signal to the photosensitive region 930 of the optical fingerprint sensor 940. The optical fingerprint sensor 940 may receive the optical signal passing through the light path directing structure 920, and the optical signal may be used to generate fingerprint information of the finger.

In an embodiment, the filter film 910 may specifically be a plating film formed on the surface of the light path directing structure 920, and the plating film covers a part of the light path directing structure 920 corresponding to the sensing region of the optical fingerprint sensor. A flat layer or one of medium layers of the light path directing structure 940 may be used as a base material of the filter film 910 to bear the filter film 910 to form a filter for filtering out the interference light.

With the solution of the embodiment of the present application, the filter film and the light path directing structure may be integrated into the optical fingerprint sensor, thereby realizing an ultra-thin integrated optical fingerprint apparatus.

An embodiment of the present application further provides a packaging structure, and the packaging structure may include the fingerprint identification apparatus described above and a package substrate. The package substrate may refer to the substrate 540 described above. The package substrate may be an FPC board or another circuit board. The fingerprint identification apparatus may include a fingerprint sensor, the fingerprint sensor is provided with a pad connected with the package substrate, and the pad may be packaged on the package substrate in any one of the manners described above to implement the connection between the fingerprint sensor and the substrate.

The pad may also be referred to as a bonding area connected with the substrate.

Alternatively, in the embodiment of the present application, the fingerprint identification apparatus may be a fingerprint module, or the fingerprint identification apparatus may be a device including a fingerprint module and a substrate, or the fingerprint identification apparatus may be an electronic device including a fingerprint module, which is not limited in the embodiment of the present application.

Figure 10:
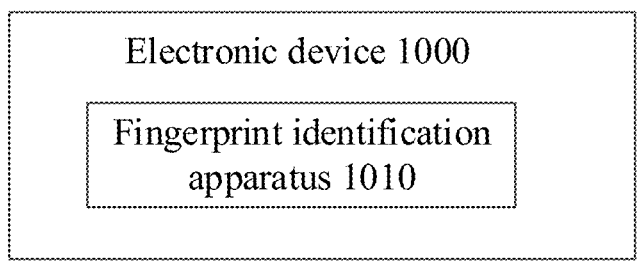
FIG. 10 is a schematic block diagram of an electronic device provided by an embodiment of the present application.

FIG. 10 is a schematic structural diagram of an electronic device 1000 provided by an embodiment of the present application, and the electronic device 1000 has a function of fingerprint identification. The electronic device 1000 may include a fingerprint identification apparatus 1010, and the fingerprint identification apparatus 1010 may be any one of the optical fingerprint apparatuses described above. Since the fingerprint identification apparatus 1010 can reduce the distance between a light path directing structure and a display screen, the thickness of the fingerprint identification apparatus can be reduced. Therefore, an electronic device using the above fingerprint identification apparatus can reduce the thickness of the electronic device and improve user experience.

The electronic device 1000 may include a display screen, the fingerprint identification apparatus may be disposed under the display screen and configured to receive an optical signal reflected by a finger on the display screen, and the optical signal may be used to generate fingerprint information of the finger.

The display screen may be a self-emitting display screen such as an OLED display screen, or may be a non-self-emitting display screen such as a LCD display screen.

It should be noted that the optical fingerprint sensor in the embodiment of the present application may represent an optical fingerprint sensor chip.

It should be noted that terms used in embodiments of the present application and the claims appended hereto are merely for the purpose of describing particular embodiments, and are not intended to limit the embodiments of the present application.

For example, the use of a singular form of "a", "said", "the above" and "the" in the embodiments of the present application and the claims appended hereto are also intended to include a plural form, unless otherwise clearly indicated herein by context.

Those skilled in the art may be aware that, units and algorithm steps of the examples described in the embodiments disclosed in this paper may be implemented by electronic hardware, computer software, or a combination of the two. Whether these functions are executed in hardware or software mode depends on a particular application and a design constraint condition of the technical solutions. Persons skilled in the art may use different methods to implement the described functions for every particular application, but it should not be considered that such implementation goes beyond the scope of the embodiments of the present application.

If the integrated unit is implemented in the form of the software functional unit and is sold or used as an independent product, it may be stored in a computer readable storage medium. Based on such understanding, the technical solutions of the embodiments of the present application substantially, or the part of the present disclosure making contribution to the prior art, or a part of the technical solutions may be embodied in the form of a software product, and the computer software product is stored in a storage medium, which includes multiple instructions enabling computer equipment (which may be a personal computer, a server, network equipment or the like) to execute all of or part of the steps in the methods of the embodiments of the present application. The storage medium includes: various media that may store program codes, such as a U-disk, a removable hard disk, a read-only memory, a random access memory, a magnetic disk, a compact disk, and so on.

It may be clearly understood by a person skilled in the art that, for the purpose of convenient and brief description, for a detailed working process of the foregoing device, apparatus, and unit, reference may be made to a corresponding process in the foregoing method embodiments, and details are not described herein again.

In the several embodiments provided by the present application, it should be understood that the disclosed electronic device, apparatus and method may be implemented in other manners.

For example, the division of the units or modules or components in the apparatus embodiments described above is only a logic function division, other division modes may be adopted in practice, for example, multiple units or modules or components may be combined or integrated in another system, or some units or modules or components may be omitted or be not executed.

For another example, the units/modules/components described as separate/display components may be or may not be physically separated, namely, may be located in one place, or may be distributed on a plurality of network units. Part of or all of the units/modules/components here may be selected according to a practical need to achieve the objectives of the embodiments of the present application.

Finally, it should be noted that the above displayed or discussed mutual coupling or direct coupling or communication connection may be indirect coupling or communication connection via some interfaces, apparatuses or units, and may be in electrical, mechanical or other forms.

The above contents are the specific embodiments of the present application only, but the protection scope of the embodiments of present application is not limited thereto, those skilled who are familiar with the art could readily think of variations or substitutions within the technical scope disclosed by the embodiments of the present application, and these variations or substitutions shall fall within the protection scope of the embodiments of the present application. Therefore, the protection scope of the embodiments of the present application should be determined with reference to the protection scope of the claims.

What is claimed is:

1. A fingerprint identification apparatus applicable to an electronic device having a display screen, comprising:
    an optical fingerprint sensor disposed under the display screen to implement under-screen optical fingerprint detection, wherein the optical fingerprint sensor comprises a photosensitive region, the photosensitive region comprises a plurality of sensing units, and the sensing units are configured to detect an optical signal returned via reflection on a finger surface;
    a light path directing structure disposed between the display screen and the optical fingerprint sensor to transmit the optical signal returned via the reflection on the finger surface to the photosensitive region of the optical fingerprint sensor; and
    a filter film formed above the photosensitive region of the optical fingerprint sensor and configured to filter the optical signal to filter out interference light;
    wherein the filter film is a plating film formed on a surface of the optical fingerprint sensor, and the plating film covers the sensing units of the photosensitive region, and the optical fingerprint sensor is used as a base material of the filter film to bear the filter film to form a filter configured to filter out the interference light; or
    wherein the light path directing structure is used as a base material of the filter film to bear the filter film to form a filter configured to filter out the interference light.

2. The fingerprint identification apparatus according to claim 1, wherein the filter film is a plating film formed on a surface of the light path directing structure, and the plating film covers a part of the light path directing structure corresponding to the photosensitive region of the optical fingerprint sensor.

3. The fingerprint identification apparatus according to claim 1, wherein the light path directing structure is integrated with the filter film and the optical fingerprint sensor into a same optical fingerprint sensor chip; or the light path directing structure is disposed above the optical fingerprint sensor as an independent component.

4. The fingerprint identification apparatus according to claim 1, wherein the light path directing structure comprises a micro-lens layer and a micro-hole layer, the micro-lens layer comprises a micro-lens array having a plurality of micro-lenses, the micro-hole layer comprises a micro-hole array having a plurality of micro-holes, and the micro-hole array is formed under the micro-lens array.

5. The fingerprint identification apparatus according to claim 4, wherein there is a one-to-one correspondence relationship between the micro-lenses and the micro-holes, and each pair of a micro-lens and a micro-hole corresponds to one of the sensing units of the optical fingerprint sensor, respectively; and the micro-lenses are configured to converge the optical signal returned via the reflection on the finger surface to the micro-holes and transmit the optical signal to corresponding sensing units through the micro-holes.

6. The fingerprint identification apparatus according to claim 5, wherein the micro-lenses and the micro-holes are aligned with the sensing units in a direction perpendicular to a surface of the optical fingerprint sensor to transmit an optical signal in a vertical direction to the sensing units under the micro-lenses and the micro-holes.

7. The fingerprint identification apparatus according to claim 5, wherein the micro-lenses and the micro-holes are aligned with the sensing units in a direction having a certain tilt angle with respect to a surface of the optical fingerprint sensor to transmit an optical signal incident at a tilt angle to the sensing units under the micro-lenses and the micro-holes.

8. The fingerprint identification apparatus according to claim 4, wherein the light path directing structure further comprises a flat layer formed on a surface of the micro-lens layer, the flat layer covers the micro-lens array, and the filter film is formed on a surface of the flat layer, wherein the flat layer is used as a base material of the filter film to bear the filter film.

9. The fingerprint identification apparatus according to claim 1, wherein the light path directing structure further comprises a first transparent medium layer and a second transparent medium layer, and the first transparent medium layer is formed above the micro-hole layer and at least partially fills the micro-holes; and the second transparent medium layer is formed under the micro-hole layer.

10. The fingerprint identification apparatus according to claim 9, wherein the filter film is formed on a lower surface of the second transparent medium layer, and the second transparent medium layer is used as a base material for bearing the filter film.

11. The fingerprint identification apparatus according to claim 1, wherein the light path directing structure comprises a collimator, the collimator is disposed above the filter film and comprises a collimating through hole array having a plurality of collimating through holes, and an extension direction of the collimating through holes is perpendicular to a surface of the optical fingerprint sensor or has a certain tilt angle with respect to a surface of the optical fingerprint sensor.

12. The fingerprint identification apparatus according to claim 1, wherein an upper surface of the optical fingerprint sensor is provided with a first pad for connecting with a substrate.

13. The fingerprint identification apparatus according to claim 12, wherein the optical fingerprint sensor is provided with a trench, a surface of the trench is lower than the upper surface of the optical fingerprint sensor, the surface of the trench is provided with a second pad for connecting with the substrate, and the first pad and the second pad are electrically connected through a redistribution layer.

14. The fingerprint identification apparatus according to claim 13, wherein a difference in height between the surface of the trench and the upper surface of the optical fingerprint sensor is greater than or equal to 30 μm.

15. The fingerprint identification apparatus according to claim 12, wherein the optical fingerprint sensor further comprises a through silicon via, and the through silicon via is used to connect the first pad to the substrate.

16. The fingerprint identification apparatus according to claim 15, wherein a lower surface of the optical fingerprint sensor is provided with a solder ball for soldering to the substrate, and the first pad is connected to the solder ball through the through silicon via.

17. The fingerprint identification apparatus according to claim 1, wherein the optical fingerprint sensor is a backside illumination fingerprint sensor, and the backside illumination fingerprint sensor is configured in a flip chip packaging manner to enable a front side to face a substrate and a back side to face the display screen, and the filter film is plated on a back side of the optical fingerprint sensor.

* * * * *